United States Patent [19]

Bernhardt et al.

[11] Patent Number: 5,241,450
[45] Date of Patent: Aug. 31, 1993

[54] THREE DIMENSIONAL, MULTI-CHIP MODULE

[75] Inventors: Anthony F. Bernhardt, Berkeley; Robert W. Petersen, Pleasanton, both of Calif.

[73] Assignee: The United States of America as represented by the United States Department of Energy, Washington, D.C.

[21] Appl. No.: 850,642

[22] Filed: Mar. 13, 1992

[51] Int. Cl.$^5$ .............................................. H05K 7/20
[52] U.S. Cl. .................................... 361/689; 361/699; 361/744; 361/784; 361/412; 257/712; 257/724
[58] Field of Search ............................ 357/74, 75, 81; 361/393, 396, 406, 412, 413, 414, 382, 385, 386–389

[56] References Cited

U.S. PATENT DOCUMENTS

| | | |
|---|---|---|
| 2,786,969 | 3/1957 | Blitz ..................... 361/393 |
| 2,898,522 | 8/1959 | Handen ................. 361/393 |
| 3,614,541 | 10/1971 | Farrand ................. 361/412 |
| 4,450,472 | 5/1984 | Tuckerman et al. . |
| 4,489,363 | 12/1984 | Goldberg . |
| 4,525,921 | 4/1985 | Carson et al. ......... 29/577 C |
| 4,573,067 | 2/1986 | Tuckerman et al. . |
| 4,574,331 | 3/1986 | Smolley ................ 361/393 |
| 4,630,172 | 12/1986 | Stenerson et al. ..... 361/414 |
| 4,646,128 | 2/1987 | Carson et al. ......... 357/74 |
| 4,686,606 | 8/1987 | Yamada et al. . |
| 4,801,992 | 1/1989 | Golubic . |
| 4,833,568 | 5/1989 | Berhold . |
| 4,841,355 | 6/1989 | Parks . |
| 4,893,174 | 1/1990 | Yamada et al. . |
| 4,894,709 | 1/1990 | Phillips et al. . |
| 4,992,847 | 2/1991 | Tuckerman . |
| 5,025,306 | 6/1991 | Johnson et al. . |
| 5,128,831 | 7/1992 | Fox, III et al. ....... 361/396 |

FOREIGN PATENT DOCUMENTS 0101067 5/1986 Japan ..................... 357/75
0286266 12/1987 Japan ..................... 357/75

OTHER PUBLICATIONS

Goldman, et al.; "Area Array Solder Interconnections for VLSI", Solid State Technology; Jun. 1983; pp. 91–97.

Goldberg; "Narrow Channel Forced Air Heat Sink"; IEEE Transactions on Components, Hybrids and Manufacturing Technology; vol. CHMT-7, No. 1, Mar., 1984; pp. 154–159.

Tuckerman, et al.; "High-Performance Heat Sinking for VLSI"; IEEE Electron Device Letters; vol. ED-2, May, 1981; pp. 126–129.

Shanken, et al.; "Very High Density 3-D Packaging of Integrated Circuits"; published by Irvine Sensors Corporation; date unknown, maybe 1988.

Primary Examiner—Gregory D. Thompson
Attorney, Agent, or Firm—Henry P. Sartorio; Roger S. Gaither; William R. Moser

[57] ABSTRACT

A plurality of multi-chip modules are stacked and bonded around the perimeter by sold-bump bonds to adjacent modules on, for instance, three sides of the perimeter. The fourth side can be used for coolant distribution, for more interconnect structures, or other features, depending on particular design considerations of the chip set. The multi-chip modules comprise a circuit board, having a planarized interconnect structure formed on a first major surface, and integrated circuit chips bonded to the planarized interconnect surface. Around the periphery of each circuit board, long, narrow "dummy chips" are bonded to the finished circuit board to form a perimeter wall. The wall is higher than any of the chips on the circuit board, so that the flat back surface of the board above will only touch the perimeter wall. Module-to-module interconnect is laser-patterned o the sides of the boards and over the perimeter wall in the same way and at the same time that chip to board interconnect may be laser-patterned.

66 Claims, 12 Drawing Sheets

THREE DIMENSIONAL, MULTI-CHIP MODULE

The United States government has rights in this invention pursuant to Contract Number W-7405-ENG-48 between the United States Department of Energy and the University of California for the operation of Lawrence Livermore National Laboratory.

CROSS REFERENCE TO RELATED APPLICATION

The present application is related to U.S. patent application entitled MICROCHANNEL COOLING OF FACE DOWN BONDED CHIPS, Ser. No. 07/850,634, filed on the same day as the present application, and owned at the time of invention and currently by the same assignee.

BACKGROUND OF THE INVENTION

1. Field of the Invention

The present invention relates to integrated circuit packaging technology, and particularly to three dimensional packages involving high density stacks of integrated circuits.

2. Description of Relates Art

There is increasing need to produce compact integrated circuit pac'.iges. Packaging technology must improve as integrated circuit clocks speeds increase because package delays contribute a significant fraction of computer cycle times. Thus, the board level computing elements (e.g., packaged dice or integrated circuit chips) must shrink, just as the size of the basic integrated circuit computing elements had to shrink to accommodate increases in chip clock rate. Also, in aerospace, aviation, and other applications, the reduction of size and weight is an extremely important goal in tis own right, independent of speed.

In the case of high speed logic or power devices, high packing densities needed to achieve these goals raise important questions of cooling. Commercial mainframe computer dissipate almost 20 watts per square centimeter, but with future generations of gallium-arsenide logic they may generate over 40 watts per square centimeter. With future ECL bipolar logic they may generate over 100 watts per square centimeter of heat.

Other problems associated with packaging advanced integrated circuit technology arise from the wire bonding, tape automated bonding (TAB), and flip-chip interconnect technology conventionally used. In particular, these technologies limit the input/output capabilities of densely packaged systems. Further, as clock speeds continue to increase, the inductance of TAB and wire bonds start to limit edge speeds and clock rates.

Hybrid water-scale packaging has been developed to address many of these problems. These hybrid wafer-scale packages consist of integrated circuits bonded to a silicon circuit board, which, in turn, may be bonded to a microchannel heat sink. Integrated circuit chips are bonded by a thin film eutectic bond to the silicon circuit board. Such bond provides intimate thermal and mechanical contact with the board. The silicon circuit board has a planarized thin film interconnect system. Laser patterning permits chip to circuit board interconnects to be fabricated directly on vertical walls of the attached chips. This laser patterning results in higher I/O density and better electrical characteristics than achievable by wire bonding or TAB. Incorporation of the microchannel heat sink reduces overall package thermal resistance per unit area by a factor of more than 50 compared to conventional computer cooling technology.

Thus, the hybrid wafer-scale packaging permits densely packed integrated circuits, while accommodating large heat flux and high pinout generally associated with fast LSI, VLSI, and ULSI parts. To achieve further advances, it is desirable to extend this technology and related technologies from two dimensions at the board level, to the third dimension at the system level.

SUMMARY OF THE INVENTION

The present invention extends hybrid wafer-scale packaging technology into the third dimension to achieve size and weight decreases for integrated circuit systems. The size decrease also allows a speed increase, since the board-to-board wire length can be significantly reduced.

According to one aspect of the invention, a plurality of multi-chip modules (MCMs) are stacked and bonded. At least one side can e left unbonded, and used for coolant distribution, for more interconnect structures, or other features, depending on particular design considerations of the MCMs. An MCM comprises a circuit board, having a planarized interconnect structure accessible at a first major surface, and integrated circuit chips bonded to the circuit board.

The chips may be bonded to the circuit board using "flip-chip" type technology, or they may be bonded o the back side with interconnects patterned around the sides of the chips into the planar interconnect on the circuit board using laser-patterning techniques.

Around the periphery of each circuit board, long, narrow "dummy chips" are bonded to the finished circuit board to form a perimeter wall. The wall is higher than any of the chips on the circuit board, so that the flat back surface of the board above will only touch the perimeter wall. Module-to-module interconnect is laser-patterned on the sides of the boards and over the perimeter wall in the same way, and possibly at the same time, that chip to board interconnect may be laser-patterned. Upper connections may be easily differentiated from downward connections, so that intermodule routing can be handled on the module itself. For this reason, and the density of module-to-module connections, no multi-level interconnect apart from the module stack, or other backplane interconnect structure is needed. The module-to-module interconnect is formed using co-planar transmission lines, so signal reflection at the interface between the circuit boards is avoided. The space between the boards is nominal, and board thickness, dictated by a mechanical and heat flow considerations, is a few tens of mils. In some applications, microchannel cooling structures may be coupled to the backs of the boards to provide for efficient cooling.

In order to test each board prior to stacking and bonding, co-planar transmission lines are expanded in lateral dimensions into a two dimensional array of probe points on the back of the module. This allows probe separation to a comfortable 15-20 mils, from approximately 4 mil line separation achievable using laser-patterning on the sides and bonding surfaces of the boards. In general, this allows the interconnect structures on unpopulated modules to be tested before high value items, namely the chips, are attached. Next, the functionality of the populated module may be tested. The probe array on the bottom module of a stack may be used to test the functionality of the finished stack. Following the tests, the back side test probe pads can be severed from the board interconnects by laser ablation so that they do not become stubs, which reduce signal rise time.

The heat flow characteristics of the stack may be improved by providing interior walls, or pedestals, providing heat flow paths vertically through the stack. In addition, transmission lines or power and ground conductors may be coupled with the pedestals or interior walls to improve the flexibility of the interconnect structure.

Other aspects and advantages of the present invention can be seen upon review of the figures, the detailed description, and the claims which follow.

DESCRIPTION OF THE PREFERRED EMBODIMENTS

A detailed description of preferred embodiments of the present invention is provided with respect to FIGS. 1-12.

Figure 1:
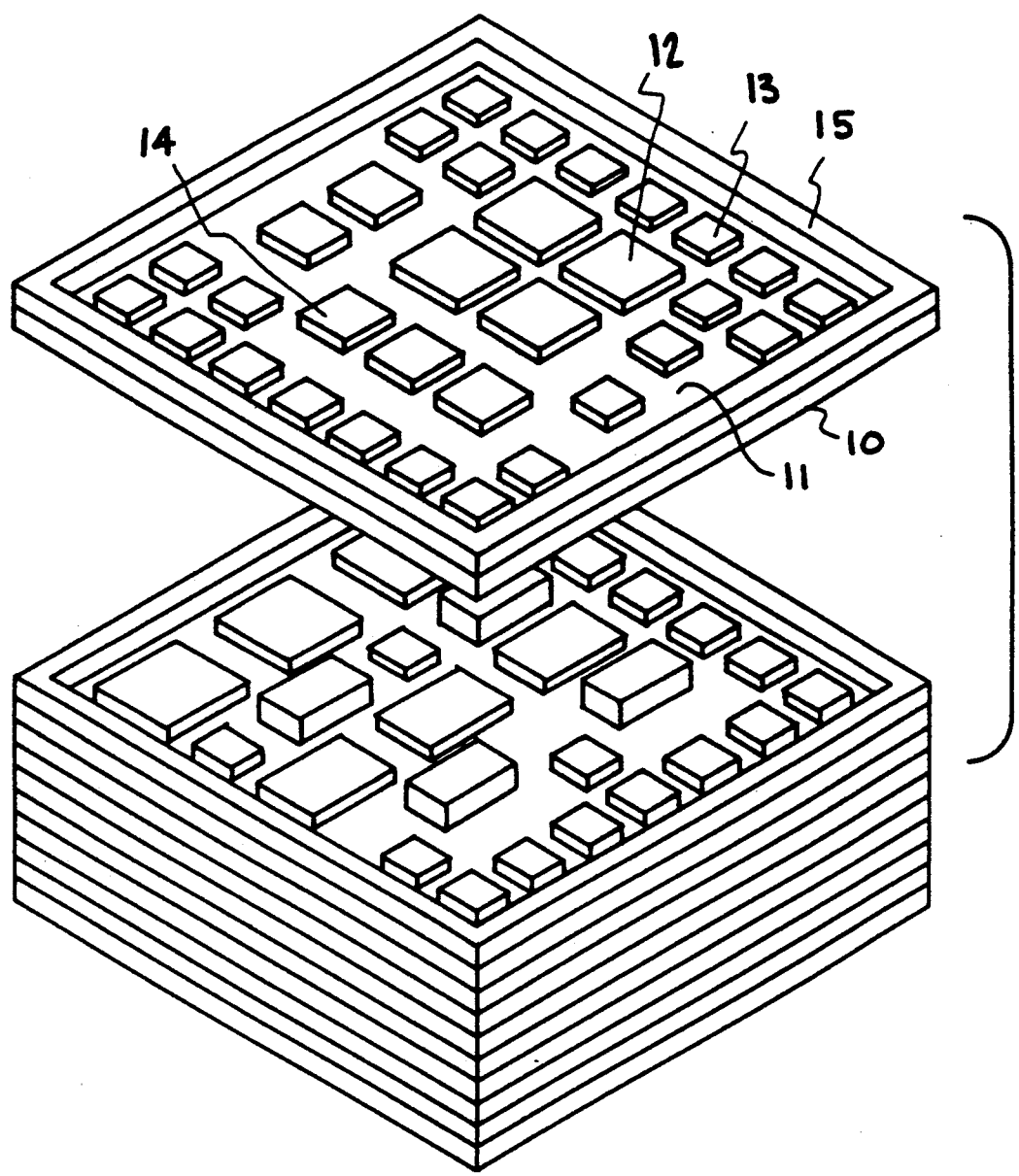
FIG. 1 is a perspective view of a three dimensional multi-chip module according to the present invention.

FIG. 1 illustrates a three dimensional hybrid wafer-scale package including individual multi-chip modules (e.g., module 10) which are stacked and solder bump bonded around their peripheries. Solder connects co-planar transmission lines on one module to those on its mates so that impedance discontinuities and parasitics are avoided. Bonds between the modules are inspectable and repairable because they are formed around the periphery of the circuit board.

The multi-chip modules 10 each include a circuit board 11, and a plurality of integrated circuit chips 12, 13, 14 for instance, mounted on the circuit board 11. A periphery wall 15, which can be formed of individual spacer members, is bonded to the periphery of the circuit board 11. The peripheral wall 15 supports co-planar transmission lines and power and ground conductors for connecting between the modules.

Figure 2:
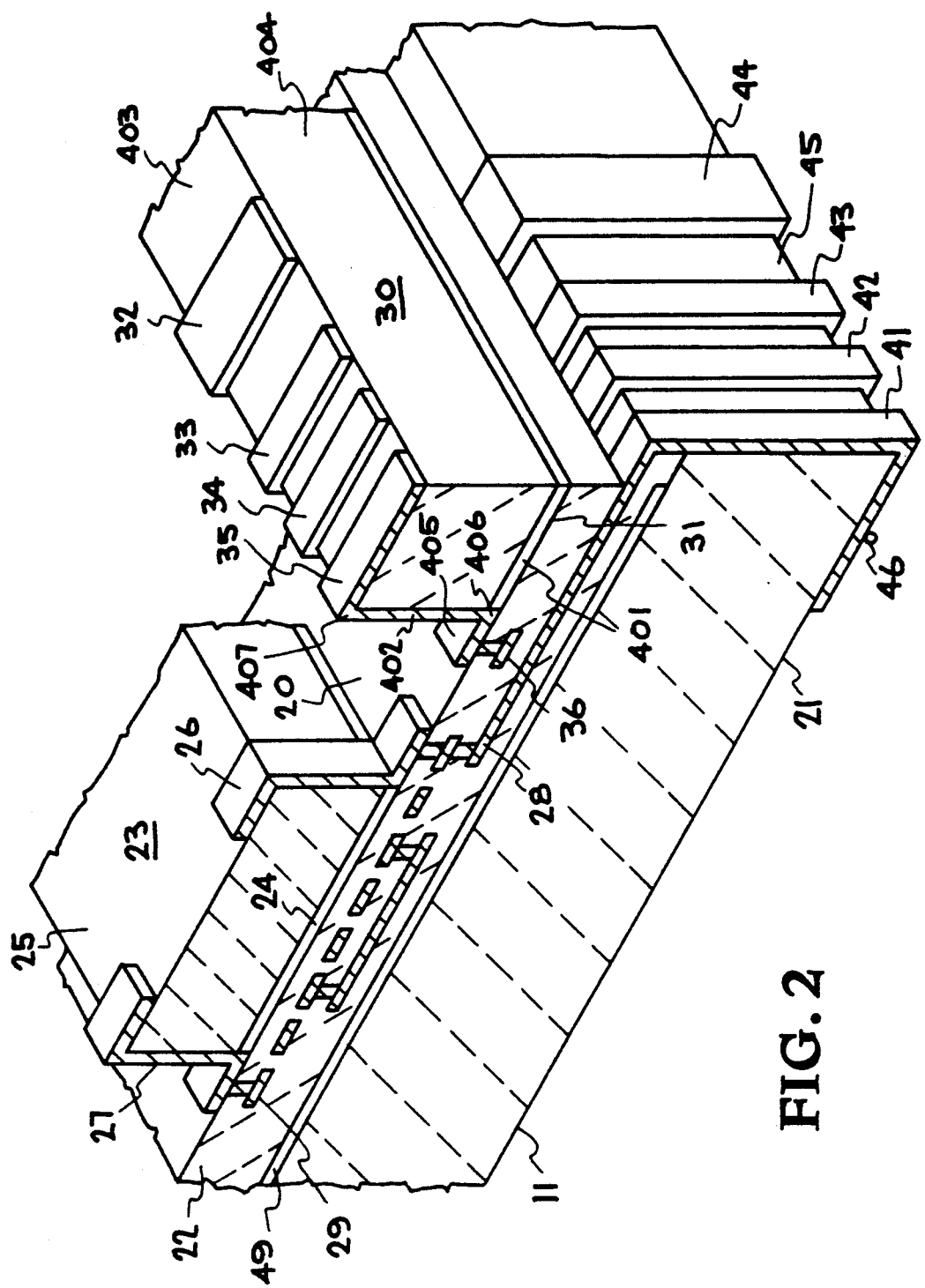
FIG. 2 is a cross-section view of a portion of a multi-chip module illustrating the interconnect structure and bonding techniques in a preferred embodiment of the present invention.

FIG. 2 provides a close-up view of the interconnect structure in the multi-chip modules according to the present invention. As can be seen in FIG. 2, the circuit board 11 has a first major surface 20 and a second major surface 21. On the first major surface 20, a planarized, multi-level, thin film interconnect structure 22 is formed. Integrated circuit chips (e.g., chip 23) are bonded to the planarized interconnect 22 using a thin film eutectic 24 o the back surface of the chip. On the top surface 25 of the chip 23, openings to the integrated circuit bond pads (not shown) are formed. Interconnect conductors 26, 27 are laser-patterned around the sides of the chip 23 to the planarized interconnect structure 22 and bonded to respective conductors 28, 29 within the nulti-level thin film interconnect 22.

The laser-pattern technology (laser pantography) is described in detail in my U.S. patent entitled "PROCESS FOR PREPARATION OF A SEED LAYER FOR A SELECTIVE METAL DEPOSITION", U.S. Pat. No. 5,098,526. Basically, the interconnects are laser patterned around the sides of the chip after the chip is bonded to the circuit board.

The multi-chip module also includes a peripheral wall 30 which is bonded to the planar interconnect structure by eutectic bond 31. Laser-patterned interconnects 32, 33, 34, 35 are formed up an inside surface of the peripheral wall 30 and over the top of the peripheral wall. The laser-patterned conductors, e.g., conductor 35, are coupled to respective conductors, e.g., conductor 36, in the planarized interconnect 22.

Similarly, laser-patterned conductors 41, 42, 43, and 44 are patterned around a side 45 of the circuit board 11, and extend to the second major surface 21 of the board.

Solder bumps 46, or other conductive bonding elements, are utilized to provide connections between the conductors on the tops of the peripheral walls on an adjacent multi-chip module (not shown) and the conductors on the second major surface 21 of the circuit board 11.

The interconnects around the sides 45 of the circuit boards 11 and over the tops of the peripheral walls 30 include co-planar transmission lines, such as formed by conductors 41, 42 and 43 between multi-chip modules. Also, power buses may be formed using larger conductors, such as conductors 44 and 32.

The conductors 41, 42, and 43 comprise a co-planar transmission line, where conductor 41 is ground, conductor 42 is a signal line, and conductor 43 is ground. This pattern of ground, signal, ground, signal may be continued along the sides of the circuit boards, and over the perimeter walls 30 to provide a series of co-planar transmission lines. These co-planar transmission lines are coupled to transmission lines in the planarized thin film interconnect 22 so that signals are propagated from the bonded chip 23 across impedance controlled transmission lines at the speed of light from chip to chip, and module to module. The transmission lines in the planarized interconnect 22 may be formed using microstrip technology which includes a ground plane 49 which is equidistant from signal lines, e.g., line 28. Also, as known in the art, rather than ground-signal-ground-signal, the transmission lines may be implemented with the supply voltage alternated with the signal lines.

Using the transmission line or impedance controlled interconnect, the quality of signal transmission from chip to chip is preserved, substantially independent of the distance of propagation provided line resistance, R, is less than twice the impedance of the line as is known in the art. Thus, a square wave signal which is generated on a first chip in the stack will be communicated as a square wave to other chips in the stack, whether they are on the same circuit board, or located in a circuit board module different from the originating chip.

Since interconnections between the multichip modules are formed on the sides of the circuit boards, they are readily accessible for inspection and testing during manufacturing, or when performing diagnostic tests on the system.

As can be seen in FIG. 2, the perimeter wall 30 has a first surface 401, a second surface 402, a third surface 403, and a fourth surface 404. The module-to-module interconnect structure is formed on at least two of the four surfaces. As shown, the interconnect is coupled from bonding site 36 to a thin film conductor 405 on the surface of the planarized interconnect 22. The thin film conductor 405 then proceeds around corner 406 formed by the surface of the planarized interconnect 22 and the second side 402 of the perimeter wall 30, up the side 402, around the corner 407 formed by the second surface 402 and the third surface 403 of the perimeter wall 30, and continues across the third surface 403 of the perimeter wall. This thin film interconnect structure which proceeds across two sides of the perimeter wall is formed using laser pantography, and allows the unique stacking of modules with transmission line interconnects between modules of the present invention, and a highly compact three-dimensional integrated circuit packaging system.

According to a preferred embodiment of the present invention, the circuit board 11 and the perimeter wall 30 are formed using silicon. Silicon is a well characterized material, suitable for eutectic or solder bump bonding and formation of interconnect structures as illustrated in FIG. 2. Alternatively, aluminum nitride AlN may be utilized for the circuit board and the perimeter walls. Also, these materials may be mixed. Aluminum nitride may be preferred because of its superior strength per unit thickness and excellent heat conduction properties. Also, the thermal expansion coefficient of aluminum nitride is quite close to that of silicon, which is most typically used for the chips 23 in such systems. Alternative systems may use co-fired ceramic boards with embedded or surface interconnect structures.

Figure 3:
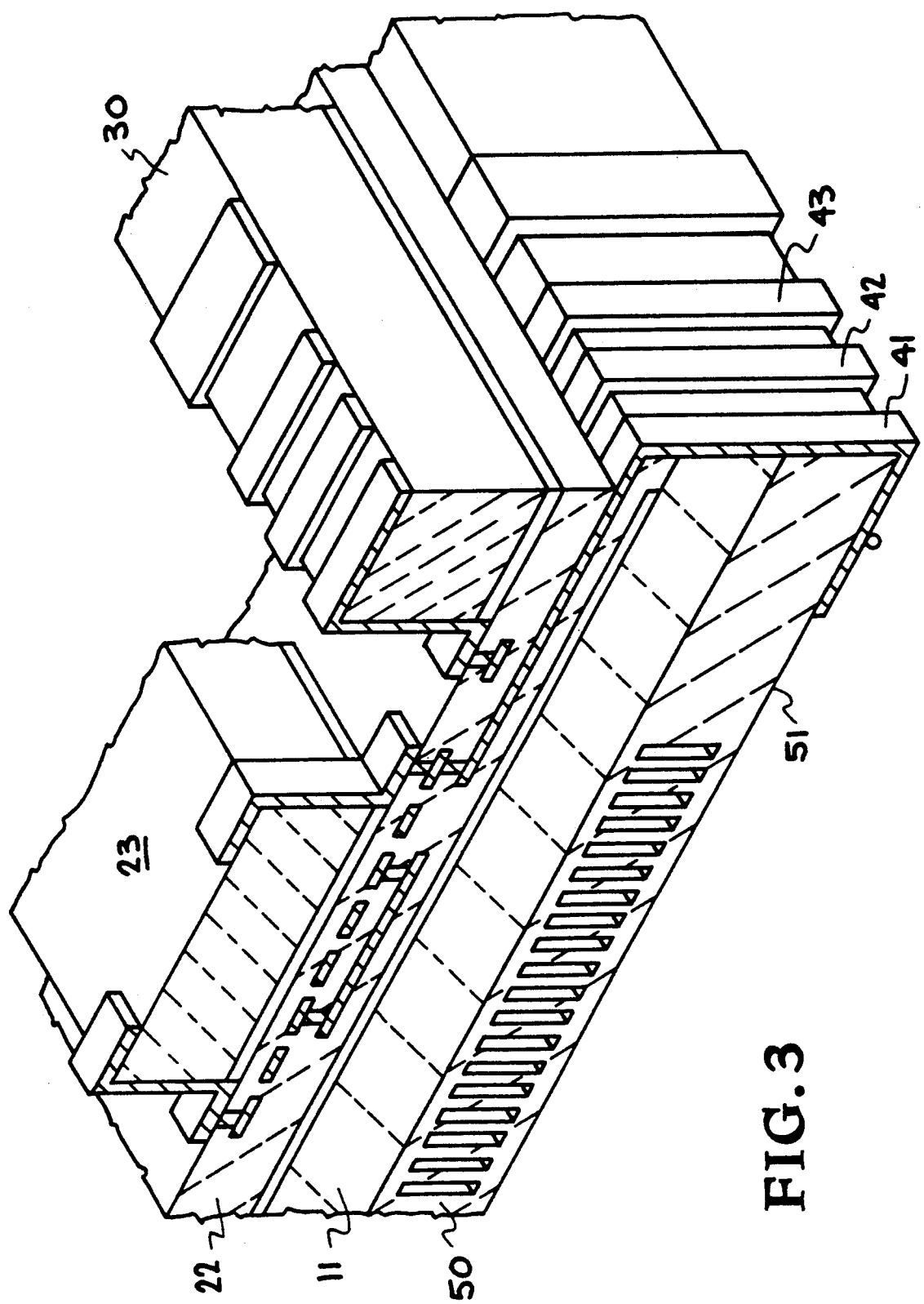
FIG. 3 is a cross-section view of a multi-chip module with a microchannel heat sink according to a preferred embodiment of the present invention.

As illustrated in FIG. 3, the multichip modules may further comprise a heat sink 50, such as a microchannel heat sink bonded to, formed on or otherwise coupled with, the circuit board 11. In this embodiment, the laser-patterned conductors 41, 42, 43 extend around the side of the circuit board 11 to the back side 51 of the heat sink for solder bump bonding to adjacent modules in the stack, and coolant is supplied to the heat sink from one end of the module at a side of the stack and removed at the same end or the opposite end.

The integrated circuit board modules shown in FIG. 3 may be used only as the bottom module in the stack so that heat conducted from modules higher in the stack proceed through the perimeter walls down to the heat sink 50. Alternatively, heat sinks, such as heat sink 50 may be interspersed throughout the stack with sources of coolant flow contacting the heat sink along exposed sides of the stack.

The heat sink 50 is typically manufactured using silicon or aluminum nitride in order to provide an excellent heat conduction and structural member for the circuit board 11.

Figure 4:
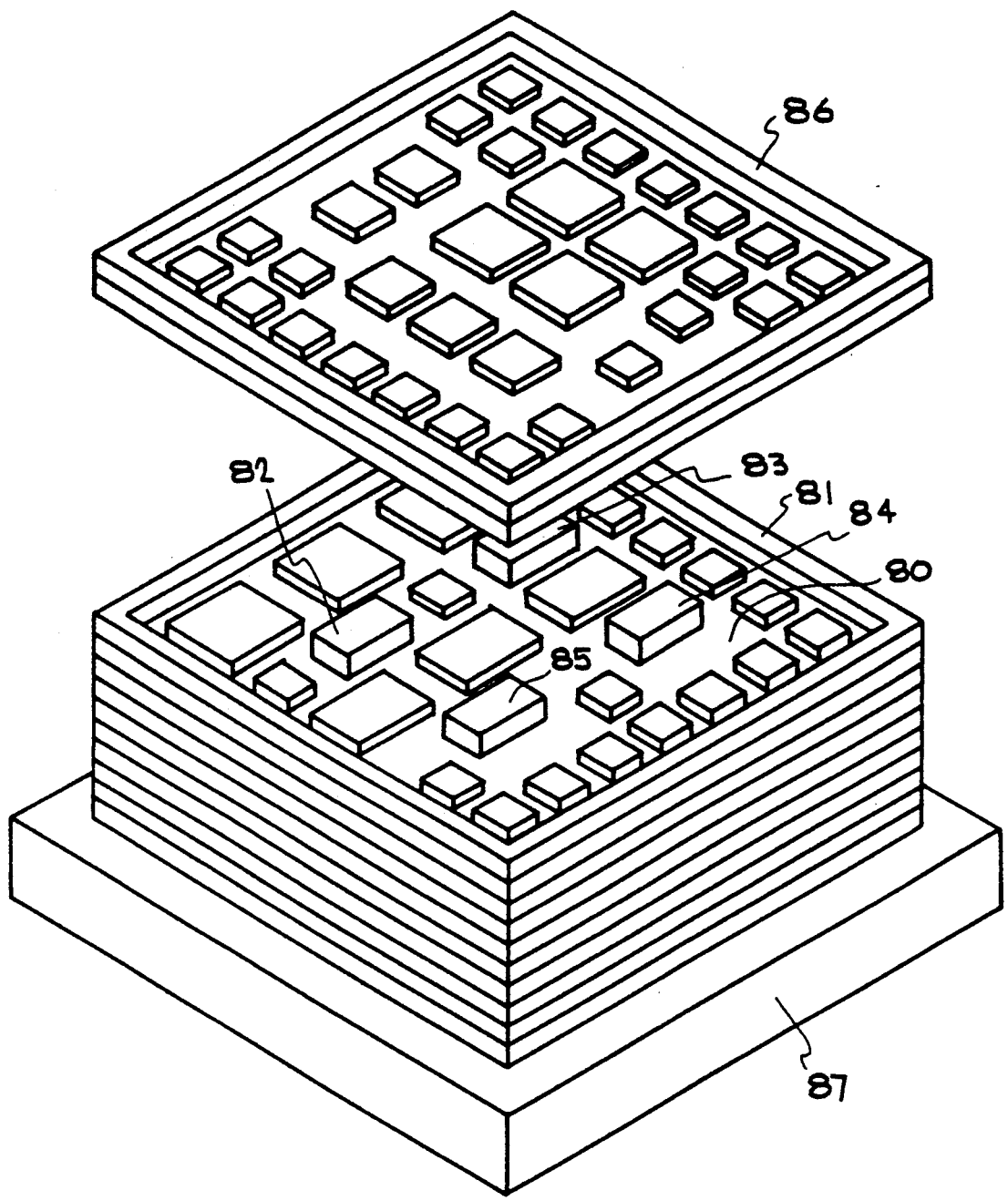
FIG. 4 is a schematic diagram of a three dimensional stack of multi-chip modules according to the present invention, having a heat sink on the bottom multi-chip module, and interior pedestals in addition to the peripheral walls for improving heat flow vertically through the stack.

To improve heat flow vertically through the stack, the stack of modules may be implemented as illustrated in FIG. 4. In the embodiment of FIG. 4, the modules in the stack include circuit board 80 having perimeter walls 81 bonded around the periphery of the circuit board 80. In addition, pedestals 82, 83, 84, 85, or interior walls, which have the same height as the perimeter walls 81, are bonded inside the perimeter of the circuit board 80. The pedestals 82-85 are bonded to a first major surface of the circuit board 80, and to a second major surface of circuit board 86. The bonds provide a heat conduction path vertically through the stack. Also, intermodule interconnects may be formed on or through the pedestals which can be interconnected through a thin film interconnect on the second major surface of the circuit board 86 or by means of vias through the circuit board to the planar interconnect on the first major surface of the circuit board module 86. In this embodiment, a heat sink 87 is mounted on the bottom module of the stack by which heat conducted along the perimeter walls and through the pedestals of the modules in the stack is dissipated.

Figure 4A:
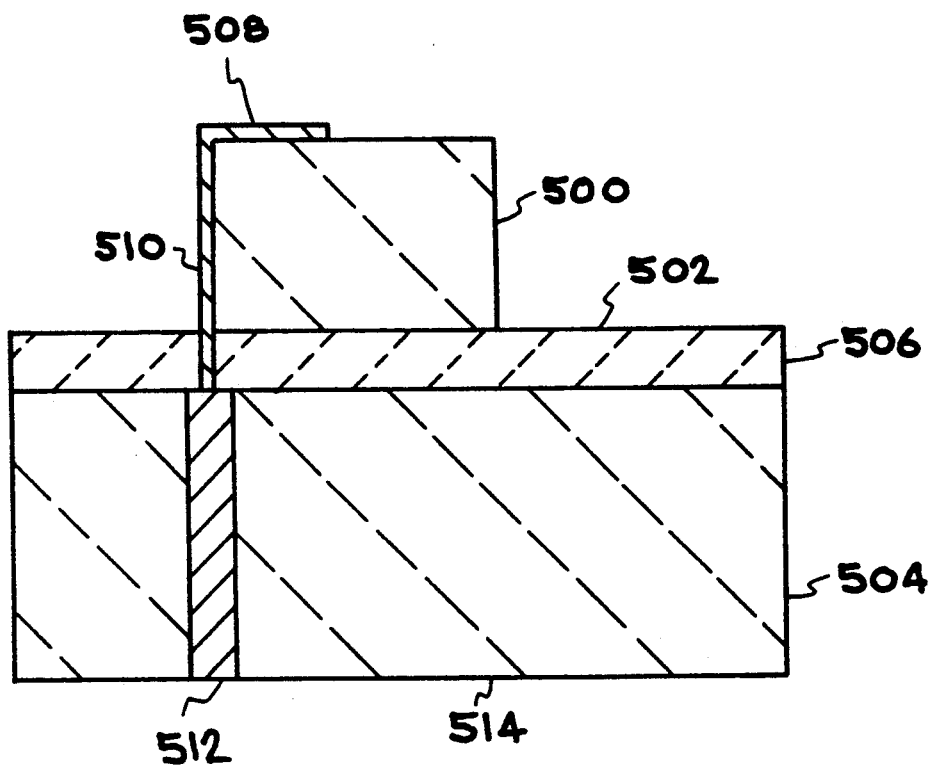
FIG. 4A is a sectional view of a portion of a circuit board showing a pedestal and intermodule interconnect.

FIG. 4A shows a possible configuration of a pedestal and intermodule interconnect. A pedestal 500 is mounted on the top surface 502 of the circuit board 504 at the chip interconnect 506. An intermodule interconnect 508 can be formed on two sides of the pedestal 500 and connected to a conductor 510 within the chip interconnect 506. The intermodule interconnect 508 can be connected by means of a via 512 to the bottom 514 of the circuit board 504 for connection with another circuit board.

Figure 5:
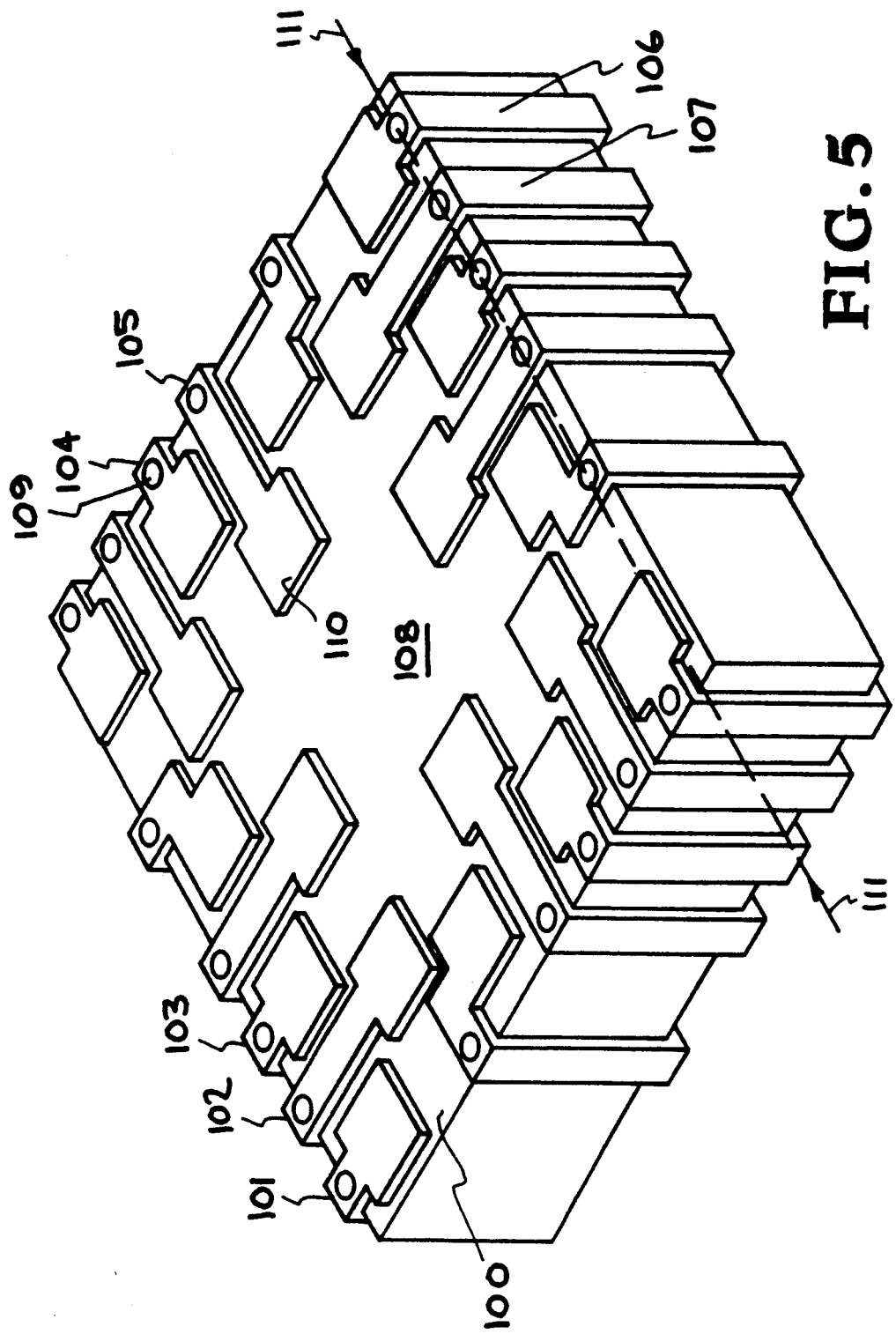
FIG. 5 is a heuristic diagram of a test probe pattern on the back side of a multi-chip module according to the present invention.

FIG. 5 illustrates the test probe pattern on the underside of a module 100. The module 100 includes a plurality of laser-patterned interconnects (e.g., 101-107) which pass along the sides of the circuit board and wrap around to the underside 108 of the module 100. Around the periphery of the underside 108, the interconnects are adapted for solder bump bonding, as schematically illustrated by small circles 109 on the interconnects 104 and elsewhere in the figure. The interconnects, according to this aspect of the invention, extend to enlarged probe pads, which facilitate probing the board with test equipment. In this way, the interconnects, which may have spacings as narrow as one to four thousandths of an inch (mils), may be coupled to test pads, which may have spacings as large as 15 mils. After assembly of the board, and before integrated circuits are mounted on the opposite side, the interconnect structure can be tested by contacting the probe pads (e.g., pad 110). In a next manufacturing step, the integrated circuit chips are mounted on the top side of the module 100. After mounting integrated circuits, the functionality of the module can be tested using the probe. After testing the entire module with integrated circuits mounted thereon, the test pads may be isolated from the interconnect using laser ablation along the line 111. Similarly, in a final manufacturing step, after the modules have been bonded in the stack, the module on the bottom of the stack may have a test pattern which can be used for the testing of the assembled stack.

FIGS. 6-12 illustrate an embodiment of the present invention using "flip-chip" bonded integrated circuits on the stack modules with microchannel cooling on the top side of the integrated circuits.

Figure 6:
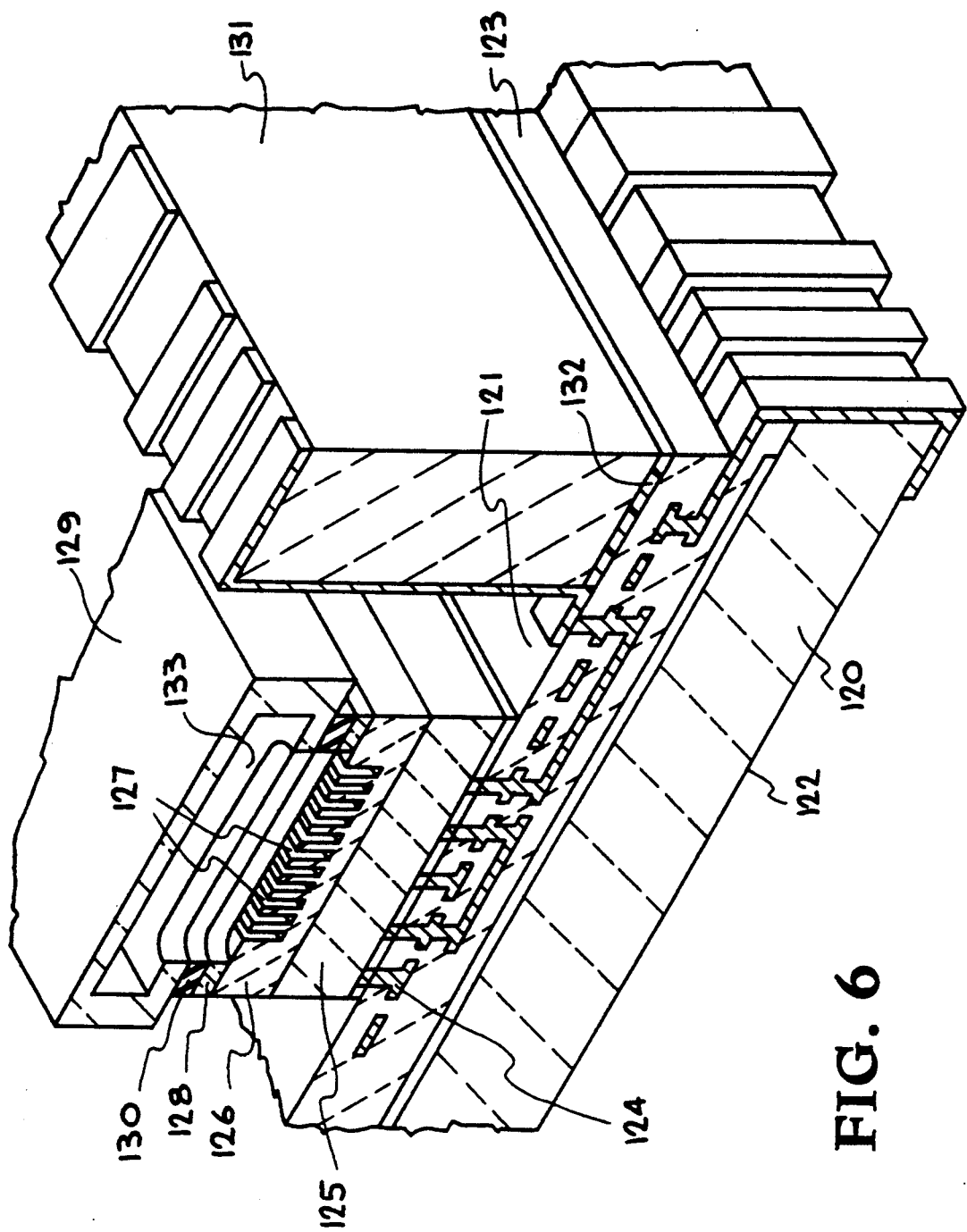
FIG. 6 is a cross-section view of a multi-chip module with flip-chip bonding and individual chip micro-channel cooling.

As shown in FIG. 6, each module includes a circuit board 120 having a first major surface 21 and a second major surface 122. Near the first major surface 121 of the circuit board 120, a thin film, planarized interconnect 123 is formed. The interconnect 123 has chip bonding sites (e.g., 124) accessible at the first major surface. The chip bonding sites are adapted for flip-chip or solder bump bonding to corresponding bonding sites on the integrated circuit chip 125. Bonded to, formed on, or otherwise coupled with, the back of the integrated circuit chip 125 is a substrate 126 having a plurality of grooves (e.g., 127). A groove cover 128 is bonded to the grooved substrate 126 providing cooling channels along the grooves 127 in the substrate 126. Openings are provided at each end of the grooves so that a coolant flow path is provided along the grooves. A coolant supply manifold 129 is then coupled to the groove cover 128 using a compressible elastomer seal 130. The compressible elastomer seal 130 surrounds openings in the coolant supply manifold at each end of the grooves 127 to confine flow of the coolant through the channels formed by the grooves. Also, the compressible elastomer seal 130 has a sufficient thickness to account for variations in height of the chips due to manufacturing tolerances or other variations. The perimeter wall 131 for the module formed with the microchannel cooling has a height greater than the combined height of the flip-chip mounted integrated circuit 125, the microchannel groove substrate 126, the groove cover 128, the elastomer seal 130, and the coolant supply manifold 129. In the example illustrated, heat dissipation is assumed to be 150 W/cm$^2$ on $12 \times 12$ mm chips; the coolant supply manifold is sized to cool a pair of rows of 10 chips each using water as the coolant. The resulting perimeter wall height is about 7 mm. This perimeter wall is bonded using a eutectic bond 132 as illustrated with respect to FIG. 2.

Laser-patterned interconnects along the sides of the circuit board 120 and up the sides of the perimeter wall 131 are provided.

Figure 7:
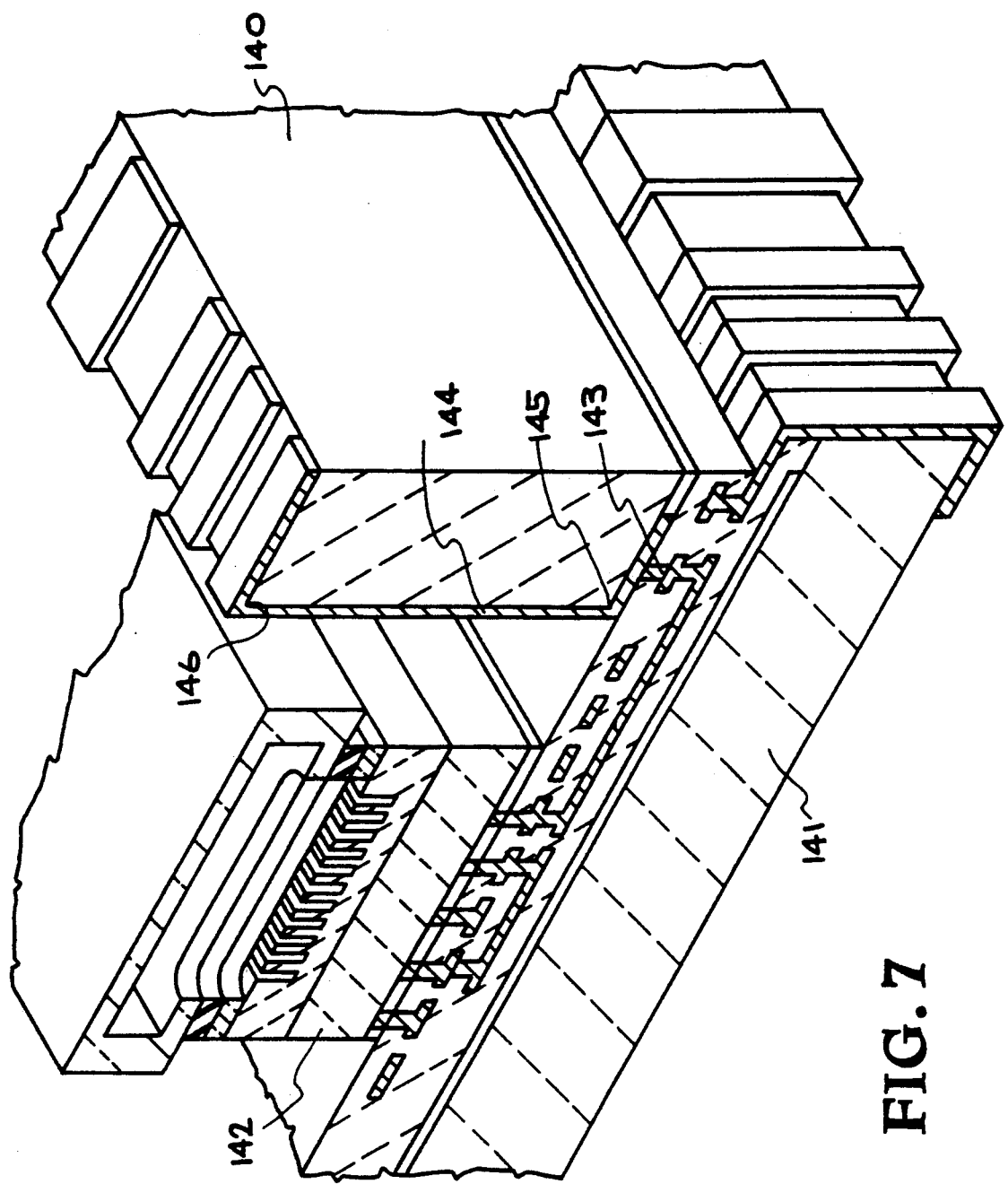
FIG. 7 is a cross-section view of an alternative technique for bonding the perimeter walls on the multi-chip modules using solder bump technology.

FIG. 7 illustrates an alternative technique for mounting the perimeter wall 140 on a circuit board 141. According to this technique, controlled collapse, solder bump bonding is used on both the top and bottom surfaces to mount the perimeter wall 140 on the circuit board, in the same manner as the chips 142 are mounted on the circuit board 141. Thus, the planar interconnect will include a bonding site 143 adopted for solder bump bonding to the conductors 144 on the perimeter wall. Conductors wrap around three sides of the perimeter wall and are formed using laser pantography. In this embodiment, the laser pantography is carried out in two steps, forming conductors around the bottom corner 145 in a first step and a top corner 146 in a second step.

The coolant used in the microchannel cooling system of FIG. 6 can be water, a dielectric fluid such as Coolanol (a silicate ester available from Monsanto, St. Louis, Mo.), air, or other cooling fluid or gas. Coolants with a large heat capacity and thermal conductivity allow for implementation with smaller dimensions to facilitate dense integrated circuit packaging.

Figure 8:
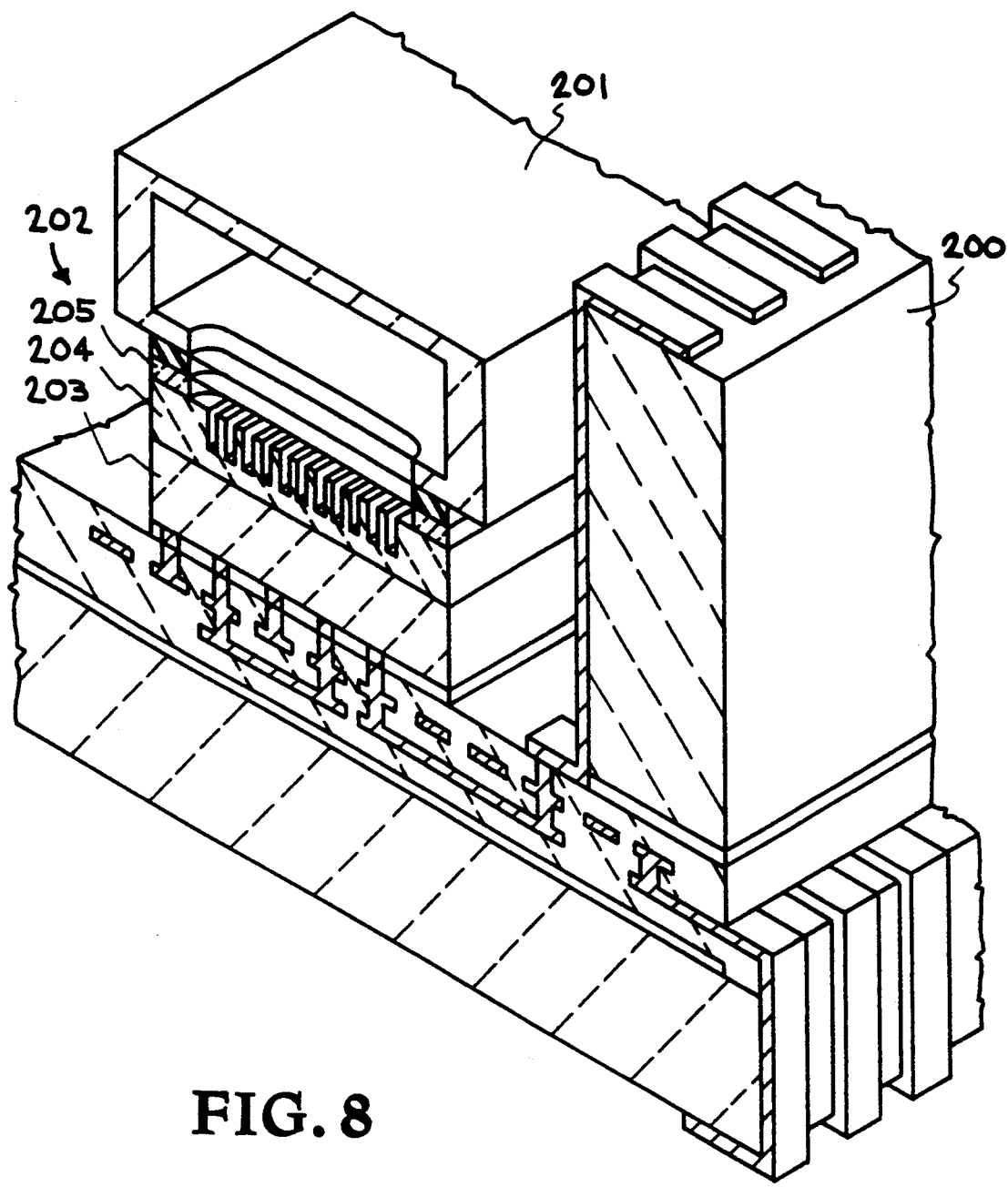
FIG. 8 is a cross-section view of an alternative multi-chip module with a microchannel cooling system adapted for air as the coolant.

FIG. 8 illustrates an embodiment adapted for air cooling of pairs of rows of 10 chips each, where the chips generate about 20 W/cm$^2$. In this embodiment, the perimeter wall 200 may be approximately 10 mm high. This allows for a coolant supply manifold 201 approximately 5 mm high and an integrated circuit module 202, which includes the integrated circuit 203, the grooves substrate 204, and the cover 205, of approximately 2 mm in height.

Figure 9:
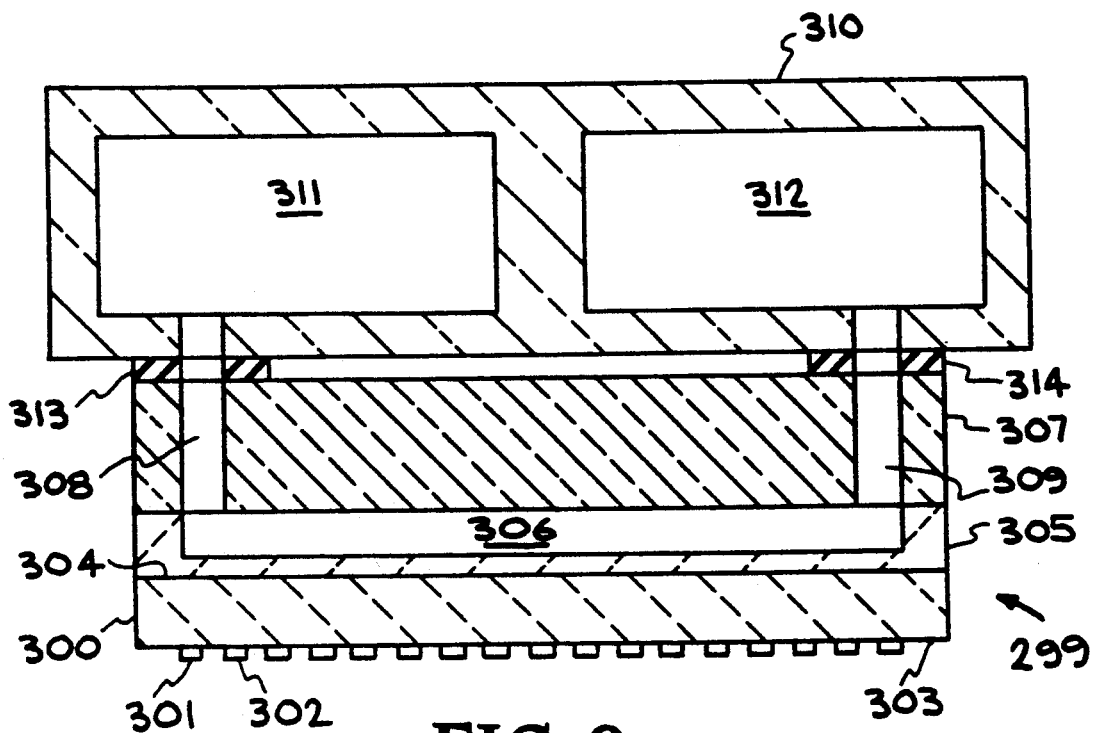
FIG. 9 is a cross-section view of an integrated circuit module with microchannel cooling, taken along the microchannel according to one embodiment of the present invention.

FIG. 9 provides a cross-sectional view of an integrated circuit module apart from the stacked interconnect system. According to this embodiment, each module includes an integrated circuit chip 300 having a plurality of solder bump bonding sites (e.g., 301, 302) formed on a first major surface 303 of the chip 300. Also on the first major surface 303 an integrated circuit is formed on the chip.

The second major surface 304 of the integrated circuit chip is bonded to a microchannel structure 305 which includes a plurality of grooves 306. A microchannel cover manifold is bonded to the microchannel structure 305. The manifold 307 is manufactured using glass or other material compatible with bonding to the microchannel structure 305. The cover manifold 307 includes coolant delivery channels 308, 309 which provide a coolant flow path through the cover manifold 307 to the grooves 306 in the microchannel structure 305. The coolant delivery channels 308, 309 are fed coolant through a coolant supply manifold 310. The coolant supply manifold 310 includes a first flow path 311, and a second flow path 312. The first flow path 311 provides higher pressure coolant into the coolant delivery channel 308, while the flow path 312 provides a lower pressure path from the coolant delivery channel 309. An elastomer seal 313 seals the junction between the flow path 311 and the coolant delivery channel 308, and elastomer seal 314 seals the junction between the coolant delivery channel 309 and the coolant flow path 312. The elastomer seals 313, 314 consists of a compressible material, such as neoprene, viton, or the like, which allows the coolant supply manifold 310 to be placed over the chip module of FIG. 9 with sufficient pressure to form a seal for the coolant flow while allowing for differences in height of the integrated circuit modules on a given circuit board that arise due to manufacturing tolerances, warping, and the like.

Figure 10:
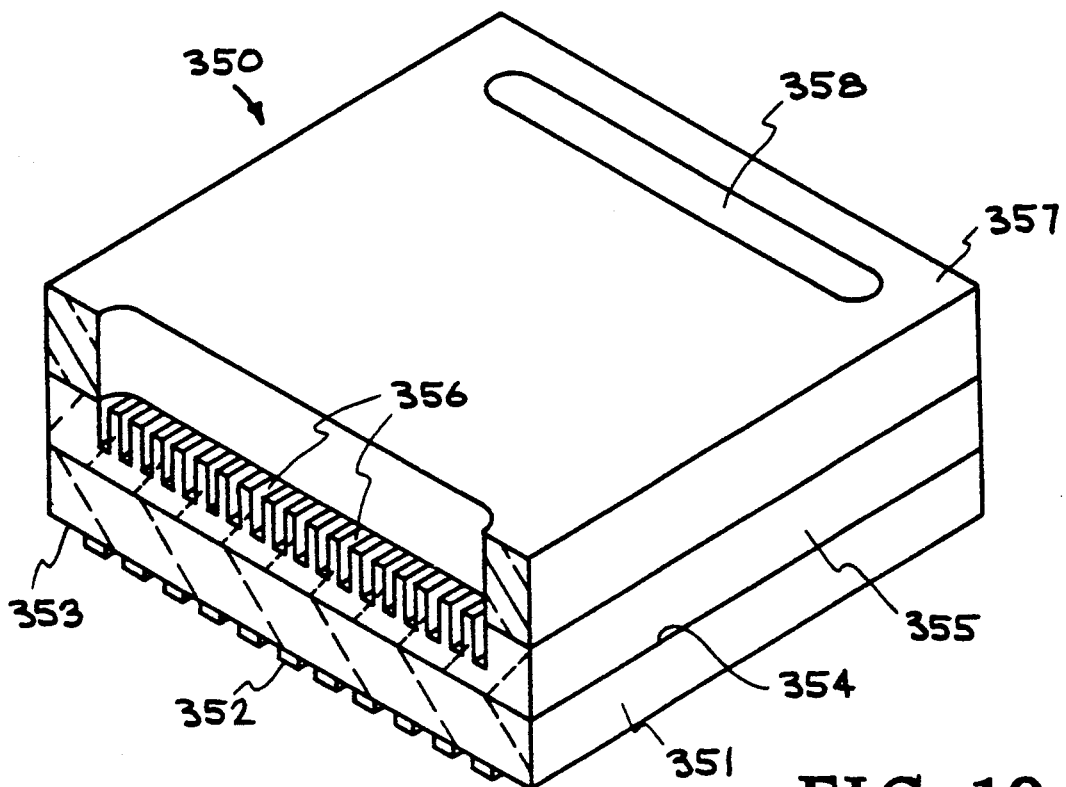
FIG. 10 is a perspective view of an integrated circuit module with microchannel cooling according to the present invention.

FIG. 10 illustrates a perspective view of an integrated circuit module 350 according to this aspect of the invention. The integrated circuit module includes an integrated circuit chip 351 having solder bump bonding sites 352 along a first major surface 353 of the chip. The second major surface 354 of the chip 351 is bonded to a microchannel structure 355. A plurality of microchannels 356 are formed in the microchannel structure 355. The cover manifold 357 is bonded to the microchannel structure 355. The coolant delivery channel 358 is cut or formed in the cover manifold 357 as illustrated in FIG. 10.

Because the coolant supply manifold (310 of FIG. 0) is removable, and the solder bump bonding allows removal of each chip module individually, he present technique allows implementation of microchannel cooling on a chip by chip basis in a large circuit board. Furthermore, upon failure of an individual chip on the circuit board, the coolant supply manifold 310 can be removed, and individual integrated circuit modules 350 can be replaced as necessary.

Figure 11:
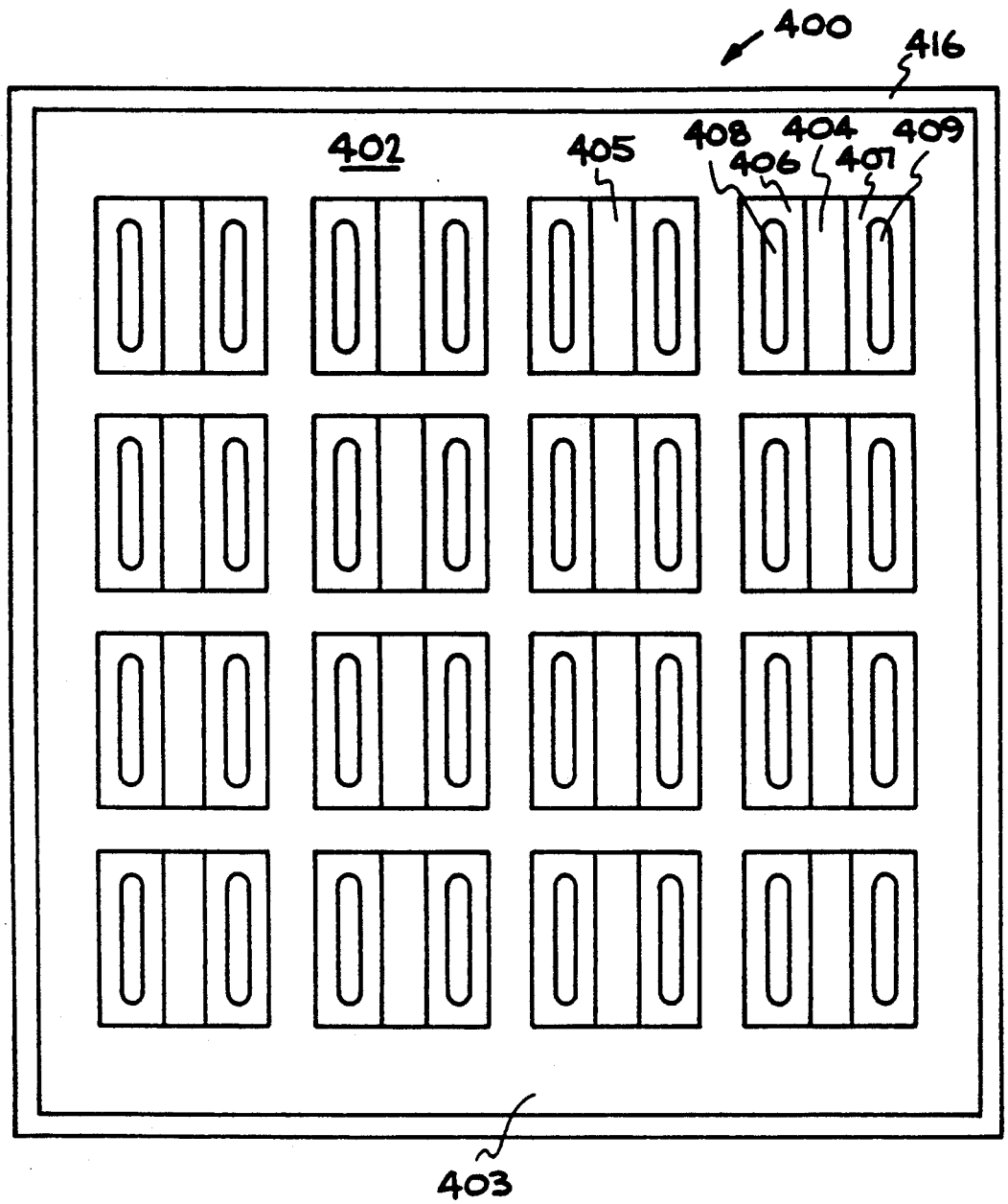
FIG. 11 is a schematic diagram of a multichip module with microchannel cooled integrated circuit modules on the circuit board.
Figure 12:
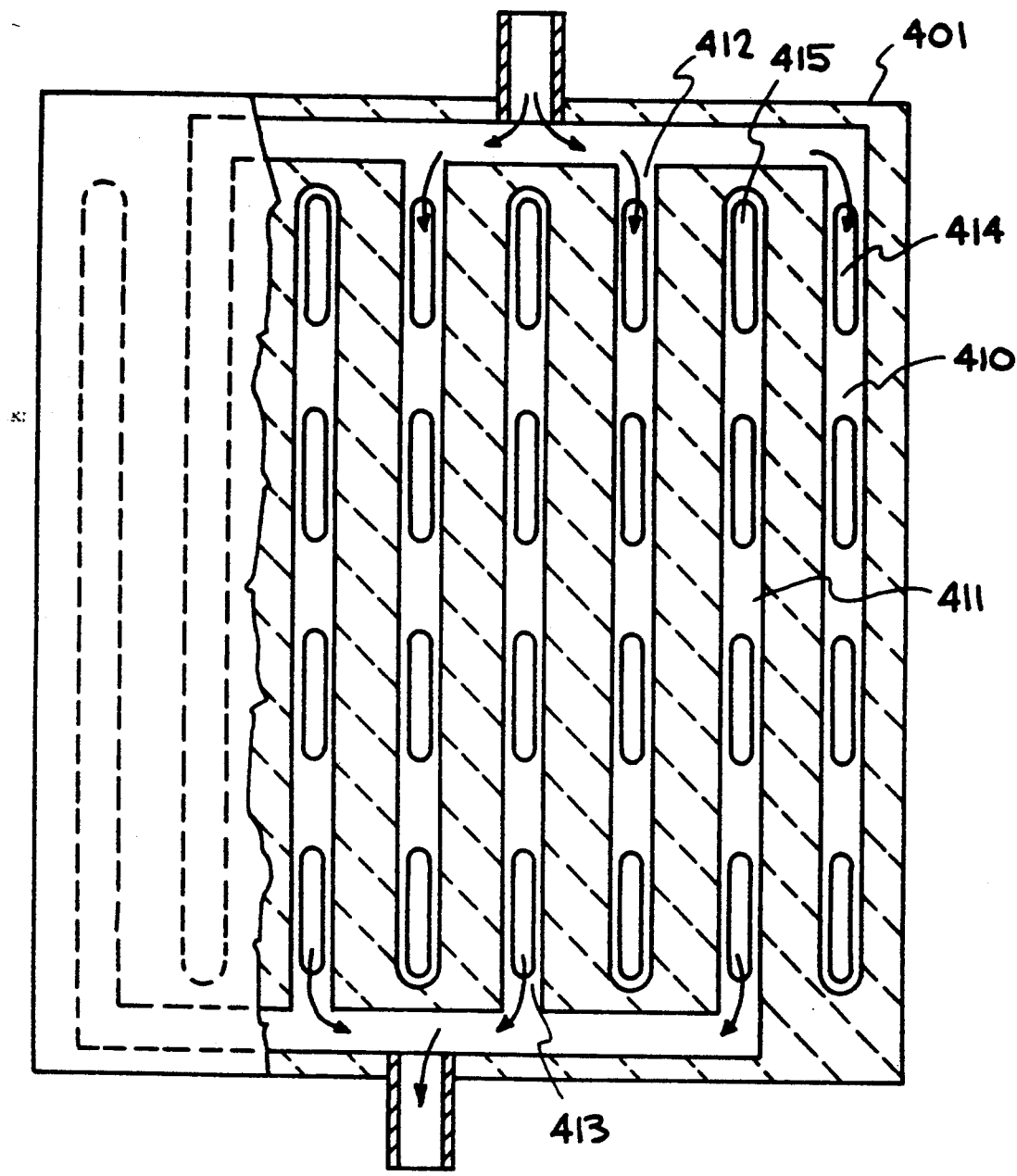
FIG. 12 is a schematic diagram of a coolant supply manifold for use with the multichip module of FIG. 11.

FIGS. 11 and 12 illustrate a circuit board module 400 and a coolant supply manifold 401 for use with the microchannel cooled IC modules of FIGS. 9 and 10. As can be seen, the circuit board module 400 includes a circuit board 402 having a first major surface 403. A plurality of integrated circuit modules (e.g., 404, 405) are bonded to the circuit board 402 using flip-chip technology. Each of the integrated circuit modules includes an integrated circuit, a microchannel structure, a cover manifold, and an elastomer seal 406, 407 around each of the coolant delivery channels 408, 409 in the coolant cover manifolds. Also illustrated heuristically in FIG. 11 is a perimeter wall 416 around the circuit board 402. Perimeter wall 416 may be implemented as illustrated in FIGS. 6 or 7 or 8 to provide for an efficient interconnect structure in a stack of individually microchannel cooled integrated circuit modules.

The coolant supply manifold 401 (FIG. 12) includes a plurality of coolant supply channels (e.g., 410, 411, 412, 413). Channels 410 and 412 are higher pressure channels while channels 411 and 413 are lower pressure channels. The manifold 401 is adapted for placement over the printed circuit board module of FIG. 11 so that the openings (e.g., 414, 415) in the coolant supply channels (e.g., 410, 411) mate with the openings (e.g., 408, 409) in the individual integrated circuit modules (e.g., 404) on the circuit board 400. The elastomer seals 406 and 407 permit the coupling of the manifold 401 with the IC circuit modules 404 while accounting for manufacturing tolerances and preventing large forces on the integrated circuit which may lead to cracks or other failures in the devices.

Accordingly, a new technology is provided extending hybrid wafer-scale packaging from the board level to the system level so as to realize size and weight decreases in the third dimension comparable to those already achieved in the plane with hybrid wafer-scale packaging. This could result in a volume fraction occupied by active semiconductors in the range of 40% or greater. A size decrease also is accompanied by a speed increase, since board-to-board wire length is significantly decreased, and board-to-board connection technology with impedance-controlled transmission lines eliminates electrical parasitics associated with essentially all connectors. Clock rates in the gigahertz range are supportable using board-to-board interconnections comprising co-planar transmission lines laser written on the sides of the stack modules. The three dimensional modules implemented as illustrated in FIG. 1 have the additional virtue that all board-to-board connections are inspectable and repairable. The packaging approach provided qualitatively advances the state of the art by taking advantage of laser pantography in three dimensional packaging of integrated circuits.

Upper connections in the stacks are differentiated from downward connections so that intermodule routing can be handled in the module itself by taking connections to circuit boards on a first side of the module around the side of the circuit board, and connections to circuit boards on the second side of the module over the top of the perimeter walls. Signal reflections at the interfaces between boards and other impedance discontinuities are avoided using the co-planar transmission line and solder bump bonding. The space between the boards is nominal, in the millimeter range, and board thickness, dictated by mechanical and heat flow considerations, can be on the order of tens of mils, except for boards requiring microchannel cooling.

The co-planar transmission lines can be expanded in lateral dimensions into a two dimensional array of probe points on the back of each module. This allows probe pad separation to a comfortable 15-20 mils from the approximately 4 mil line separation which is practical on the sides and the bonding surfaces.

As illustrated in FIG. 3, boards which require active cooling include a microchannel heat sink. Up to 500 W/cm$^2$ can be dissipated through a 50° C. temperature gradient without using heat spreaders which may reduce chip density and increase package size and weight. If the stack contains one such dissipative module, it would be located at the bottom of the stack for ease of assembly, and so that it would also provide a heat sink for the rest of the modules in the stack. The stack could also be fabricated with more than one actively cooled module having co-planar transmission line interconnect systems on their sides, just as the uncooled modules.

Although the preferred embodiments involve eutectic bonding or flip-chip bonding of the integrated circuits to the circuit boards having planarized, thin film interconnects, other bonding options are available for the multi-chip module fabrication. For example, wire bonding, TAB or other connection technologies can be used. The chips can be bonded to the multi-chip module by epoxy, eutectic bonding, or solder bonding. The dielectric used in the planarized interconnect system can be either $SiO_2$ or polyamide, or other insulating technologies compatible with the manufacturing and heat flow considerations of a given application.

Although in the system illustrated with respect to FIG. 1, all of the modules in the stack bear integrated circuits, specialized modules may be included which are compatible with the stacking technology. For instance, special interconnect modules may be included having no chips that facilitate connections between adjacent modules in the stack. Certain types of modules, for instance, mass memory modules, may be standardized so that discretionary, 3D, module-specific interconnect must be provided elsewhere.

For mechanical strength, the module perimeter should be metallized and bumped even where no module-to-module connections are required. A standardized pattern of lands and bumps might be established for ease of tooling.

The heat sink technology for multichip modules which employ flip-chip die bonding provided by the present invention allows individual microchannel cooling of flip-chip bonded integrated circuits with a coolant supply manifold sealed to the individual modules using elastomer seals.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A three-dimensional, hybrid, multi-chip module, comprising:
 (a) a plurality of circuit boards 11, arranged in a stack, each board having a top surface 20 and a bottom surface 21, wherein each circuit board comprises:
  a chip interconnect 22, formed at the top surface 20 of each circuit board, comprising a plurality of conductors 28,29 within each chip interconnect 22;
 (b) a plurality of integrated circuit chips 23, mounted on the top surface 20 of each circuit board, in electrical communication with the respective chip interconnect 22;
 (c) a plurality of means for electrically connecting chips to their respective chip interconnect 22;
 (d) a spacer member 30, mounted on the top surface 20 of at least one circuit board and connected to the bottom surface of a second, overlaying circuit board whereby adjacent boards in the stack are spaced apart;
 (e) a board interconnect 32-35, formed on at least a top surface 403 of the spacer member 30 on each board, in electrical communication with the chip interconnect 22 on the respective circuit board; and
 (f) a plurality of means on the bottom surface 21 of each circuit board, in electrical communication with the chip interconnect 22 on the respective circuit board ;
wherein the circuit boards in the stack are electrically interconnected.

2. A module as recited in claim 1, wherein the electrical connection means in (c) comprise:
 a plurality of interconnect conductors 26,27 on a top surface and at least one side of each integrated circuit chip 23, in electrical communication with the conductors 28,29 within each chip interconnect 22 on the respective circuit board.

3. A module as recited in claim 1, wherein the interconnect means in (f) comprise:
 a plurality of side conductors 41-44, extending along a side 45 and bottom surface 21 of each circuit board, in electrical communication with the chip interconnect 22 on the respective circuit board.

4. A module as recited in claim 3, wherein the interconnect means in (f) further comprise:
 a plurality of conductive bonding elements 46, connecting the board interconnect 32-35 on top of the spacer member 30 to at least one of the side conductors 41-44 on the bottom surface 21 of an overlaying circuit board in the stack.

5. A module as recited in claim 1, further comprising a plurality of spacer members that form a wall around the periphery of at least one circuit board.

6. A module as recited in claim 1, wherein at least one circuit board comprises a silicon substrate.

7. A module as recited in claim 1, wherein at least one circuit board comprises an aluminum nitride substrate.

8. A module as recited in claim 1, wherein at least one circuit board comprises a co-fired ceramic substrate.

9. A module as recited in claim 1, wherein each chip interconnect comprises a planarized thin film.

10. A module as recited in claim 1, further comprising a plurality of board interconnects, wherein at least one board interconnect is selected from the group consisting of power conductors and ground conductors.

11. A module as recited in claim 1, further comprising a plurality of board interconnects, wherein at least one board interconnect comprises a transmission line.

12. A module as recited in claim 1, wherein at least one board interconnect comprises a thin film conductor that is laser-patterned on the respective spacer member and circuit board using laser pantography.

13. A module as recited in claim 3, wherein at least one side conductor is selected from the group consisting of power conductors, ground conductors, and transmission lines.

14. A module as recited in claim 4, wherein the conductive bonding elements comprise solder bump bonds.

15. A module as recited in claim 1, further comprising:
 a microchannel cooling member coupled with at least one circuit board.

16. A module as recited in claim 1, further comprising:
 a microchannel cooling system mounted on at least one integrated circuit chip.

17. A module as recited in claim 16, wherein the cooling system comprises:
 a channeled substrate having a plurality of coolant channels, wherein the substrate is bonded to a surface of at least one chip;
 a channel cover, having a first and second opening, and bonded to the channeled substrate over the coolant channels to provide a coolant path from the first opening to the second opening through the plurality of coolant channels;
 a coolant supply manifold bonded to at least one channel cover, providing a coolant path to the first opening of the channel cover and from the second opening of the channel cover; and
 a compressible seal between the coolant supply manifold and the channel cover.

18. A module as recited in claim 1, further comprising:
 a plurality of test probe pads on the bottom surface of at least one circuit board, in electrical communication with the chip interconnect on the top surface of the respective circuit board.

19. A module as recited in claim 18, wherein the test probe pads comprise side conductors that are expanded in two dimensions on the bottom surface of the circuit board for inspecting the operability of at least one circuit board.

20. A module as recited in claim 1, further comprising:
 at least one pedestal, bonded to the top surface of at least one lower board and the bottom surface of an overlaying upper board, having a height equal to the spacer member, and providing a heat flow path between the lower and upper boards.

21. A module as recited in claim 20, further comprising:
 an intermodule interconnect, supported by the pedestal and connecting the chip interconnects on the upper and lower circuit boards.

22. A module as recited in claim 21, wherein the intermodule interconnect is selected from the group consisting of ground conductors, power conductors, and transmission lines.

23. An integrated circuit package, comprising:
 (a) a first circuit board, having a top and a bottom surface, comprising:
  a first chip interconnect, formed at the top surface of the first board, comprising a plurality of conductors within the first chip interconnect;

(b) a second circuit board, having a top and a bottom surface, the second board overlaying the first board and comprising:
  a second chip interconnect, formed at the top surface of the second board, comprising a plurality of conductors within the second chip interconnect;
(c) a plurality of integrated circuit chips, mounted on the top surface of each circuit board, in electrical communication with the respective chip interconnect;
(d) a plurality of means for electrically connecting chips to their respective chip interconnect;
(e) a spacer member, mounted on the top surface of the first board and connected to the bottom surface of the second board whereby the first and second boards are spaced apart;
(f) a plurality of board interconnects, each formed on at least a top surface of the spacer member on the first board, in electrical communication with the first chip interconnect; and
(g) a plurality of means on the bottom surface of each circuit board, in electrical communication with the chip interconnect on the respective circuit board;
wherein the first and second circuit boards are electrically interconnected.

24. An integrated circuit package as recited in claim 23, wherein the electrical connection means in (d) comprise:
  a plurality of interconnect conductors on a top surface and at least one side of each integrated circuit chip, in electrical communication with the chip interconnect on the respective board.

25. An integrated circuit package as recited in claim 23, wherein the interconnect means in (g) comprise:
  a plurality of side conductors, extending along a side and bottom surface of the second board, in electrical communication with the second board interconnect.

26. An integrated circuit package as recited in claim 25, wherein the interconnect means in (g) further comprise:
  a plurality of conductive bonding elements, connecting the side conductors on the bottom surface of the second board to the board interconnects on top of the spacer member on the first board, providing electrical communication between the first and second boards.

27. An integrated circuit package as recited in claim 23, wherein at least one circuit board comprises a silicon substrate.

28. An integrated circuit package as recited in claim 23, wherein at least one circuit board comprises an aluminum nitride substrate.

29. An integrated circuit package as recited in claim 23, wherein at least one circuit board comprises a co-fired ceramic substrate.

30. An integrated circuit package as recited in claim 23, wherein each chip interconnect comprises a planarized thin film.

31. An integrated circuit package as recited in claim 23, wherein the chips are mounted on the respective circuit boards by conductive bonds selected from the group consisting of thin film eutectic bonds, solder bump bonds, and flip-chip bonds.

32. An integrated circuit package as recited in claim 23, further comprising a plurality of spacer members that form a wall around the periphery of at least one circuit board.

33. An integrated circuit package as recited in claim 23, wherein at least one spacer member is mounted on the top surface of the first circuit board by a conductive bond selected from the group consisting of thin film eutectic bonds and solder bump bonds.

34. An integrated circuit package as recited in claim 23, wherein at least one of the board interconnects is selected from the group consisting of power conductors and ground conductors.

35. An integrated circuit package as recited in claim 23, wherein at least one of the board interconnects comprises a transmission line.

36. An integrated circuit package as recited in claim 23, wherein the board interconnects on at least one circuit board comprise thin film conductors that are laser-patterned on the respective spacer members and circuit boards using laser pantography.

37. An integrated circuit package as recited in claim 25, wherein at least one side conductor is selected from the group consisting of power conductors, ground conductors, and transmission lines.

38. An integrated circuit package as recited in claim 23, wherein the conductive bonding elements comprise solder bump bonds.

39. An integrated circuit package as recited in claim 23, further comprising:
  a microchannel cooling member in heat flow communication with at least one circuit board.

40. An integrated circuit package as recited in claim 23, further comprising:
  a microchannel cooling system mounted in heat flow communication with at least one integrated circuit chip.

41. An integrated circuit package as recited in claim 40, wherein the cooling system comprises:
  a channeled substrate having a plurality of coolant channels, wherein the substrate is bonded to a surface of at least one chip;
  a channel cover, having a first and second opening, and bonded to the channeled substrate over the coolant channels to provide a coolant path from the first opening to the second opening through the plurality of coolant channels;
  a coolant supply manifold bonded to at least one channel cover, providing a coolant path to the first opening of the channel cover and from the second opening of the channel cover; and
  a compressible seal between the coolant supply manifold and the channel cover.

42. An integrated circuit package as recited in claim 23, further comprising:
  a plurality of test probe pads on the bottom surface of at least one circuit board, in electrical communication with the chip interconnect on the top surface of the respective circuit board.

43. An integrated circuit package as recited in claim 23, further comprising:
  a pedestal, bonded to the top surface of the first board and the bottom surface of the second board, having a height equal to the spacer members, and providing a heat flow path between the first and second boards.

44. An integrated circuit package as recited in claim 43, further comprising:

an intermodule interconnect, supported by the pedestal and connecting the chip interconnects on the first and second circuit boards.

45. An integrated circuit package as recited in claim 44, wherein the intermodule interconnect is selected from the group consisting of ground conductors, power conductors, and transmission lines.

46. A three-dimensional, hybrid, wafer-scale package including multi-chip modules, comprising:
 (a) a stack of circuit boards, each board having a top surface, a bottom surface, and side surfaces, wherein each circuit board comprises:
  a chip interconnect, formed at the top surface of each circuit board, comprising a plurality of conductors within each chip interconnect;
 (b) a plurality of integrated circuit chips, mounted on the top surface of each circuit board, in electrical communication with the respective chip interconnect;
 (c) a plurality of means for electrically connecting chips to their respective chip interconnect;
 (d) a plurality of spacer members, mounted on the top surface of at least one circuit board and connected to the bottom surface of a second, overlaying circuit board, whereby adjacent circuit boards in the stack are spaced apart in the stack, and chips do not touch the bottom surface of an overlaying circuit board;
 (e) a plurality of thin film board interconnects, formed on the spacer members on each board, in electrical communication with the chip interconnect on the respective board;
 (f) a plurality of means on the bottom surface of each circuit board, in electrical communication with the chip interconnect on the respective circuit board wherein the circuit boards in the stack are electrically interconnected.

47. A three-dimensional module as recited in claim 46, wherein the electrical connection means in (c) comprise:
 a plurality of interconnect conductors on a top surface and at least one side of each integrated circuit chip, in electrical communication with the conductors within each chip interconnect on the respective circuit board.

48. A three-dimensional module as recited in claim 46, wherein the interconnect means in (f) comprise:
 a plurality of side conductors, extending along a side and bottom surface of each circuit board, in electrical communication with the chip interconnect on the respective circuit board.

49. A three-dimensional module as recited in claim 48, wherein the interconnect means in (f) further comprise:
 a plurality of conductive bonding elements, connecting the board interconnect on top of the spacer member to at least one of the side conductors on the bottom surface of an overlaying circuit board in the stack.

50. A three-dimensional module as recited in claim 46, wherein at least one circuit board comprises a silicon substrate.

51. A three-dimensional module as recited in claim 46, wherein at least one circuit board comprises an aluminum nitride substrate.

52. A three-dimensional module as recited in claim 46, wherein at least one circuit board comprises a co-fired ceramic substrate.

53. A three-dimensional module as recited in claim 46, wherein the stack of circuit boards including spacer members is substantially cube-shaped to minimize propagation distances for signals communicated among the integrated circuit chips in the stack.

54. A three-dimensional module as recited in claim 46, wherein each chip interconnect comprises a planarized thin film.

55. A three-dimensional module as recited in claim 46, wherein the integrated circuit chips are connected to the respective chip interconnect by conductive bonds selected from the group consisting of solder bump bonds, thin film eutectic bonds, and flip-chip bonds.

56. A three-dimensional module as recited in claim 46, wherein at least one board interconnect is selected from the group consisting of power and ground conductors.

57. A three-dimensional module as recited in claim 46, wherein at least one board interconnect comprises a transmission line.

58. A three-dimensional module as recited in claim 46, wherein at least one board interconnect comprises a laser-patterned thin film conductor extending along an inside surface and over the top of at least one spacer member.

59. A three-dimensional module as recited in claim 46, wherein the spacer members form a wall around a perimeter of at least one circuit board.

60. A three-dimensional module as recited in claim 46, further comprising:
 a spacer conductor, situated between at least one spacer member and the respective chip interconnect; and
 a solder bump bond between the conductors in the chip interconnect and the spacer conductor, providing electrical communication.

61. A three-dimensional module as recited in claim 60, wherein the spacer conductor comprises a thin film conductor laser-patterned on the spacer member using laser pantography.

62. A three-dimensional module as recited in claim 46, further comprising:
 a microchannel cooling member in heat flow communication with at least one circuit board in the stack.

63. A three-dimensional module as recited in claim 46, further comprising:
 a microchannel cooling system mounted in heat flow communication with at least one integrated circuit chip.

64. A three-dimensional module as recited in claim 63, wherein each microchannel cooling system comprises:
 a channeled substrate having a plurality of coolant channels, wherein the substrate is mounted on at least one chip;
 a channel cover, having a first and second opening, and bonded to the channeled substrate over the coolant channels to provide a coolant path from the first opening to the second opening through the plurality of coolant channels;
 a coolant supply manifold bonded to at least one channel cover, providing a coolant path to the first opening of the channel cover and from the second opening of the channel cover; and
 a compressible seal between the coolant supply manifold and the channel cover.

65. A three-dimensional module as recited in claim 46, further comprising:

a plurality of test probe pads on the bottom surface of at least one circuit board, in electrical communication with the chip interconnect on the top surface of the respective board.

66. A three-dimensional module as recited in claim 61, wherein the test probe pads comprise side conductors that are expanded in two dimensions on the bottom surface of the circuit board for inspecting the operability of at least one circuit board.

* * * * *